United States Patent [19]

Kasahara et al.

[11] Patent Number: 5,028,969
[45] Date of Patent: Jul. 2, 1991

[54] SEMICONDUCTOR DEVICE FOR A SPACE MODULATION MATRIX AND METHOD FOR DRIVING A SPACE MODULATION MATRIX

[75] Inventors: Kenichi Kasahara; Yoshiharu Tashiro; Mitsunori Sugimoto; Keiichi Kubota; Shigeru Kawai; Ichiro Ogura, all of Tokyo, Japan

[73] Assignee: NEC Corporation, Tokyo, Japan

[21] Appl. No.: 406,472

[22] Filed: Sep. 13, 1989

[30] Foreign Application Priority Data

Sep. 13, 1988 [JP] Japan ............................. 63-230335
Jan. 6, 1989 [JP] Japan ................................. 1-1825

[51] Int. Cl.$^5$ ........................................... H01L 31/12
[52] U.S. Cl. ................................. 357/19; 357/30; 357/16; 357/56; 357/17; 250/208.1; 250/208.2; 364/276.5
[58] Field of Search ............... 357/19, 30 G, 30 D, 357/30 E, 30 H, 30 P, 30 B, 4, 38 LA, 56, 16, 17; 250/208.1, 208.2; 364/276.5

[56] References Cited

U.S. PATENT DOCUMENTS 4,809,193 2/1989 Jourjine ........................... 364/900

FOREIGN PATENT DOCUMENTS 62-190780 8/1987 Japan .
64-84756 3/1989 Japan ................................ 357/19

OTHER PUBLICATIONS

Ohta et al., Technical Research Report OQE 87-174, 1988 Institute of Electronics Information and Communications Engineers, pp. 39-45, 1988.
Kubota et al., "Optical Crossbar Interconnection Using Vertical-to-Surface Transmission Electro-Photonic Devices (VSTEP), " Proceedings, SPIE vol. 963, Optical Computing 88, 1988, pp. 1-6.
Valentine, "Memory Systems Utilizing Light-Emitting Diodes and Photodetectors," IBM Technical Disclosure Bulletin, vol. 14, No. 12, May 1972, 3701-2.

Primary Examiner—William Mintel
Attorney, Agent, or Firm—Sughrue, Mion, Zinn, Macpeak & Seas

[57] ABSTRACT

A space modulation matrix is composed of semiconductor transmittivity modulation elements arranged in a matrix pattern. A transmittivity of the transmittivity modulation elements is changed by supplying a light or applying a voltage greater than a switching voltage of the transmittivity modulation elements to a selected number of the transmittivity modulation elements, so that a space modulation is provided on the space modulation matrix, and is renewed by any number of times.

7 Claims, 9 Drawing Sheets

SEMICONDUCTOR DEVICE FOR A SPACE MODULATION MATRIX AND METHOD FOR DRIVING A SPACE MODULATION MATRIX

FIELD OF THE INVENTION

The invention relates to a semiconductor device for a space modulation matrix and a method for driving a space modulation matrix, and more particularly to a semiconductor device including a space modulation matrix applied to neural networks, etc. and a method for driving the same.

BACKGROUND OF THE INVENTION

The research of a neurocomputer having a function similar to an information processing ability of an organism system has been intensively carried out these days. The neurocomputer is said to be superior in an intellectual information processing function such as association, reasoning, learning, etc. to a conventional von Neumann type computer, and has been proposed on pages 39 to 45 of "the technical research report OQE 87-174, 1988 in the Institute of Electronics Informations and Communications Engineers". The neurocomputer comprises input terminals to which a partial input signal is supplied, plural light emitting diode arrays each connected to the input terminals to be driven by the partial input signal, plural space modulation matrices each receiving lights from a corresponding array of the plural light emitting diode arrays, plural optical detector arrays each array detecting transmitting lights from a corresponding space modulation matrix of the plural space modulation matrices, differential amplifiers for generating differential electric signals by receiving electric signals dependent on the transmitting lights of the plural space modulation matrices from the plural optical detector arrays, thresholding devices for generating threshold signals in accordance with the thresholding of the differential electric signals, and output terminals to which the input terminals and the thresholding devices are connected in parallel to provide a complete output signal. Each of the space modulation matrices includes 32×32 glass dry plates of an emulsion type into which information of white and black is written to provide a predetermined pattern, so that the plural space modulation matrices have different information patterns from each other.

In operation, the partial input signal is supplied to the input terminals, so that the plural light emitting diode arrays are driven to emit lights dependent on a content of the partial input signal, respectively. The emitted lights are radiated from each of the light emitting diode arrays to a corresponding space modulation matrix, through which the radiated lights are transmitted dependent on the information pattern. The transmitted lights are received by each of the plural optical detector arrays, from which electric signals according to the partial input signal and the information pattern are supplied to the differential amplifiers, so that the differential electric signals are generated in the differential amplifiers by the electric signals from the plural optical detector arrays. Then, the thresholding of the differential electric signals is carried out in the thresholding devices to generate a pattern signal which is supplemental to the partial input signal, wherein the pattern signal is based on an information pattern selected from the information patterns of the plural space modulation matrices. The supplemental pattern signal is combined in the output terminals to the partial input signal, so that a complete output signal is supplied from the output terminals. Therefore, a pattern which is most similar to an incomplete input pattern can be selected from plural patterns previously stored in the space modulation matrices.

However, the neurocomputer has a disadvantage in that new information can not be written into the space modulation matrix by erasing the formerly stored information, since the space modulation matrix stores the information in the form of the white and black glass dry plates. Therefore, the degree of freedom is lowered in a practical use of the neurocomputer, since white and black glass dry plates providing a predetermined mask pattern must be newly prepared.

SUMMARY OF THE INVENTION

Accordingly, it is an object of the invention to provide a semiconductor device for a space modulation matrix in which information stored in the space modulation matrix can be erased, and new information can be written thereinto.

It is a further object of the invention to provide a semiconductor device for a space modulation matrix having a small size.

It is a still further object of the invention to provide a method for driving a space modulation matrix in which control of the space modulation matrix is easily driven.

It is a yet further object of the invention to provide a method for driving a space modulation matrix in which the space on modulation matrix can be driven in a short time.

According to a first feature of the invention, a semiconductor device for a space modulation matrix, comprises:

transmittivity modulation elements arranged in a matrix pattern to provide said space modulation matrix, a transmittivity of said transmittivity modulation elements being changed by an external energy applied thereto, and said transmittivity thus changed being held therein; and a semiconductor device array including semiconductor light emitting devices, lights emitted from said semiconductor light emitting devices radiating to a selected number of said transmittivity modulation elements in said space modulation matrix.

According to a second feature of the invention, a method for driving a space modulation matrix, comprising:

arranging transmittivity modulation elements in a matrix pattern to provide said space modulation matrix;

radiating light to a selected number of said transmittivity modulation elements in said space modulation matrix by at least one time, a transmittivity of said transmittivity modulation elements being thereby changed; and radiating light to said space modulation matrix on a first side thereof to provide transmitted lights on a second side thereof; and detecting said transmitted light to carry out a predetermined calculation.

BRIEF DESCRIPTION OF THE DRAWINGS

The invention will be explained in more detail in appended drawings, wherein:

FIG. 6a to 6C are explanatory views showing a method for driving the space modulation matrix in the first embodiment according to the invention.

DESCRIPTION OF THE PREFERRED EMBODIMENTS

Figure 1:
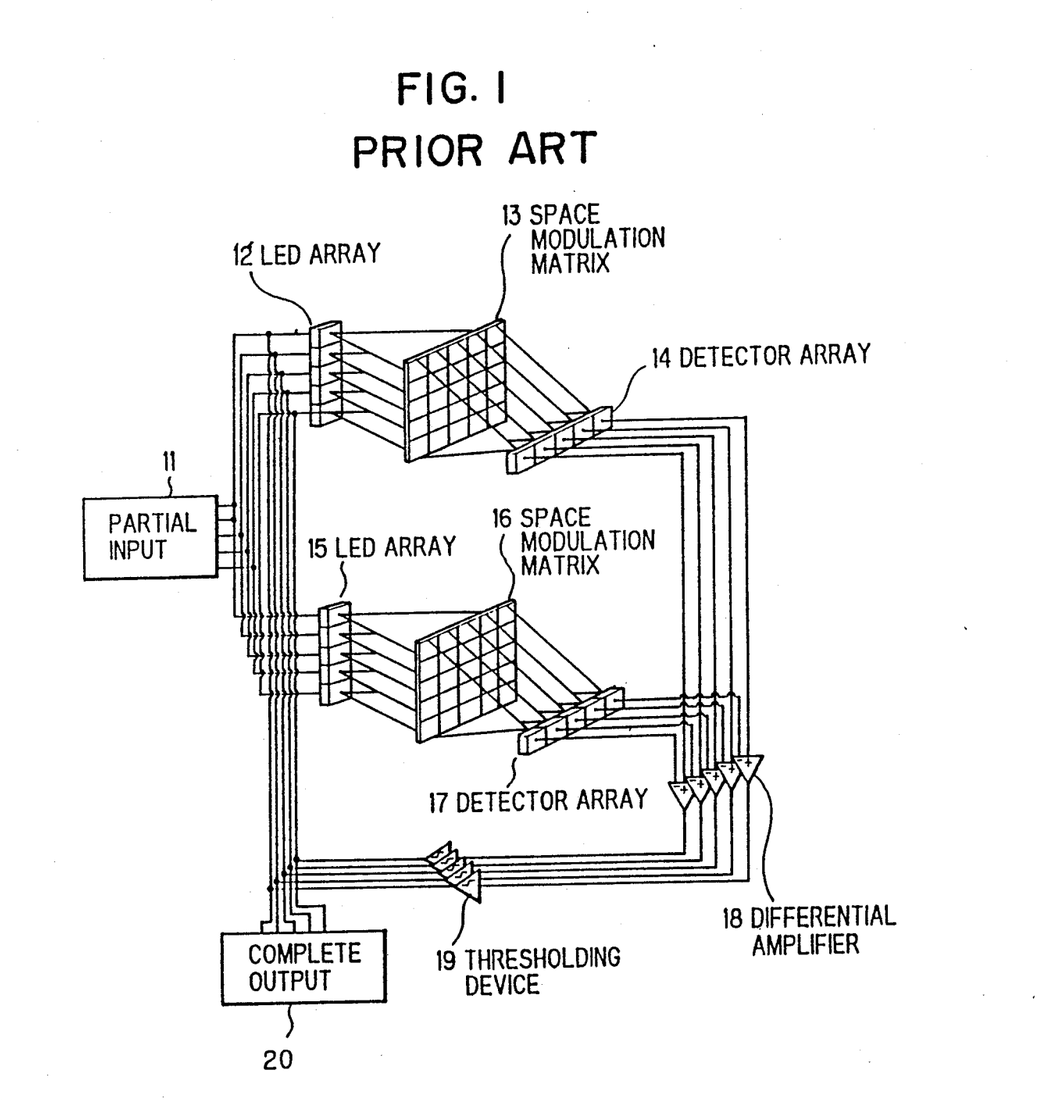
FIG. 1 is an explanatory diagram showing a conventional neurocomputer.

Before explaining an apparatus for a space modulation matrix in the first embodiment according to the invention, the aforementioned conventional neurocomputer will be explained. FIG. 1 shows the conventional neurocomputer which comprises input terminals 11 to which a partial input signal is supplied, plural light emitting diode arrays 12 and 15 which are driven to emit lights in accordance with the partial input signal, plural space modulation matrices 13 and 16 having respective information patterns defined by white and black glass dry plates through which the emitted lights are transmitted in accordance with the information patterns, plural optical detector arrays 14 and 17 receiving the transmitted lights to generate electric signals in accordance with the partial input signal and the information patterns, differential amplifiers 18 receiving the electric signal from the optical detector array 14 at a positive input and the electric signal from the optical detector array 17 at a negative input to provide differential signals, thresholding devices 19 for carrying out the thresholding of the differential signals, and output terminals 20 connected to the input terminals 11 and the thresholding devices 19 to provide a complete output signal in accordance with the partial input signal and the threshold signals. The operation and the disadvantage of the conventional neurocomputer were explained before. Therefore, they are not explained here.

Figure 2:
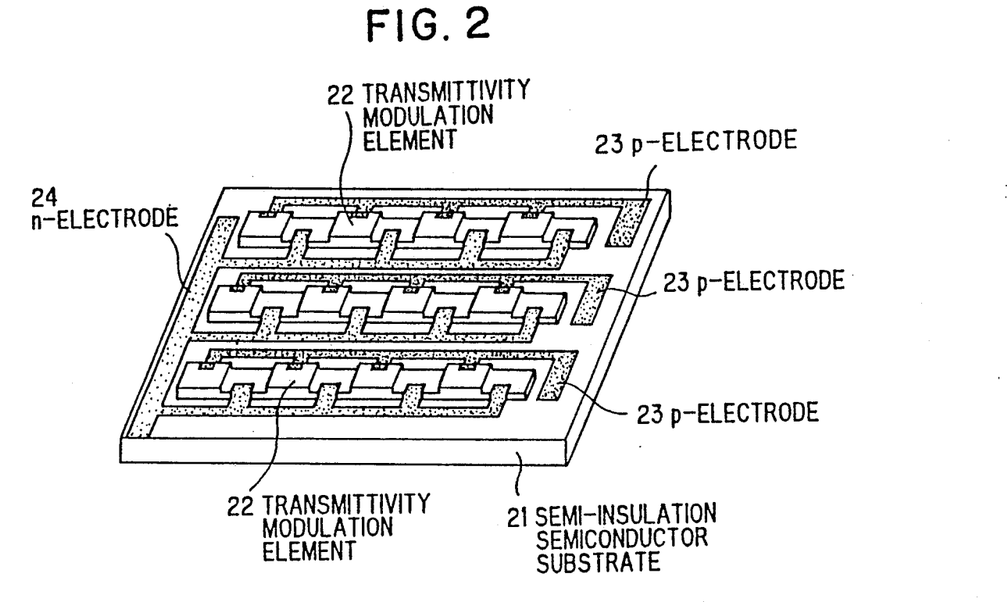
FIG. 2 is a perspective view showing a semiconductor space modulation matrix applied to a semiconductor device for a space modulation matrix in a first embodiment according to the invention.

Next, an apparatus for a space modulation matrix in the first embodiment according to the invention will be explained. FIG. 2 shows a space modulation matrix which includes transmittivity modulation elements 22 each having a size of $15 \times 15$ $\mu m^2$ arranged in a matrix pattern on a semi-insulation semiconductor substrate 21 of InP, plural p-electrodes 23 each connected to anode layers of the transmittivity modulation elements 22 in each row of the transmittivity modulation elements 22, and a common n-electrode 24 connected to cathode layers of the transmittivity modulation elements 22.

Figure 3:
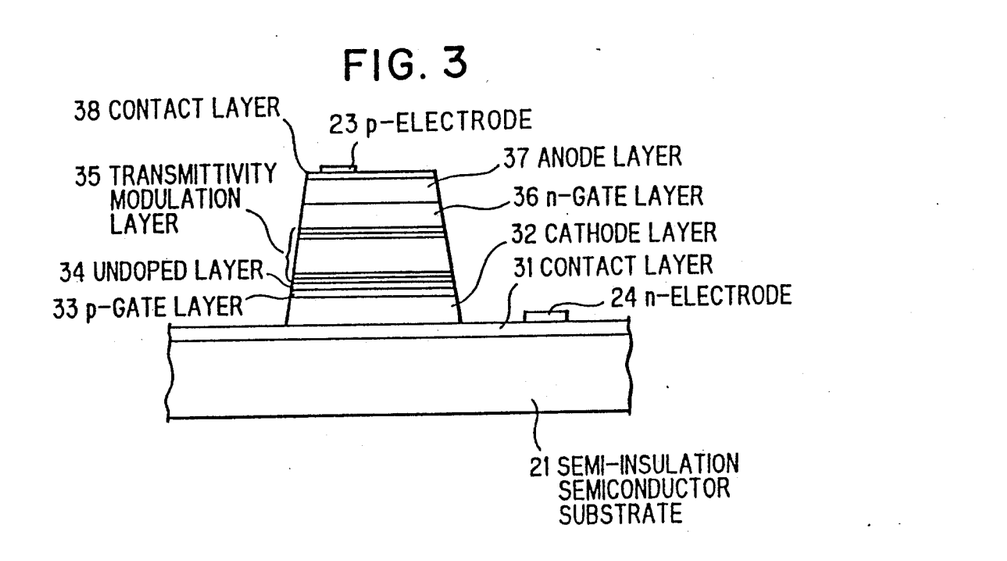
FIG. 3 is a front view showing a transmittivity modulation element in the semiconductor space modulation matrix as shown in FIG. 2.

FIG. 3 shows the transmittivity modulation element 22 provided on the semi-insulation semiconductor substrate 21 of InP as shown in FIG. 2. The transmittivity modulation element 22 comprises a contact layer 31 of n-InGaAsP having a composition corresponding to a wavelength based on a bandgap energy (defined "λg" hereinafter) of 1.3 $\mu m$, a carrier concentration of $1 \times 10^{19}$ cm$^{-3}$ and a thickness of 1 $\mu m$, a cathode layer 32 of n-InGaAsP having λg of 1.3 $\mu m$, a carrier concentration of $2 \times 10^{18}$ cm$^{-3}$ and a thickness of 2 $\mu m$, a p-gate layer 33 of p-In$_{0.53}$Ga$_{0.47}$As having a carrier concentration of $2 \times 10^{19}$ cm$^{-3}$ and a thickness of 50 Å, an undoped layer 34 of In$_{0.53}$Ga$_{0.47}$As having a thickness of 0.1 $\mu m$, a transmittivity modulation layer 35 which will be explained in more detail later, an n-gate layer 36 of n-InGaAsP having λg of 1.3 $\mu m$, a carrier concentration of $1 \times 10^{17}$ cm$^{-3}$ and a thickness of 0.5 $\mu m$, an anode layer 37 of p-InGaAsP having λg of 1.3 $\mu m$, a carrier concentration of $2 \times 10^{18}$ cm$^{-3}$ and a thickness of 1 $\mu m$, and a contact layer 38 of p-InGaAsP having λg of 1.3 $\mu m$, a carrier concentration of $1 \times 10^{19}$ cm$^{-3}$ and a thickness of 0.1 $\mu m$, successively, grown on the semi-insulating semiconductor substrate 21. The transmittivity modulation layer 35 includes one hundred undoped layers of In$_{0.53}$Ga$_{0.47}$As having a thickness of 100 Å and one hundred undoped layers of InGaAsP having λg of 1.3 $\mu m$ and a thickness of 100 Å, respectively, such that the two different undoped layers are positioned alternately one after another to provide a multi-quantum well layer. In the transmittivity modulation element 22, the p-electrode 23 is in contact with the contact layer 38, and the n-electrode 24 is in contact with the contact layer 31. The transmittivity modulation element 22 is not limited to the above described structure, but may be replaced by another optical semiconductor device such as one described in, for instance, Japanese Patent Kokai No. 62-190780.

Figure 4:
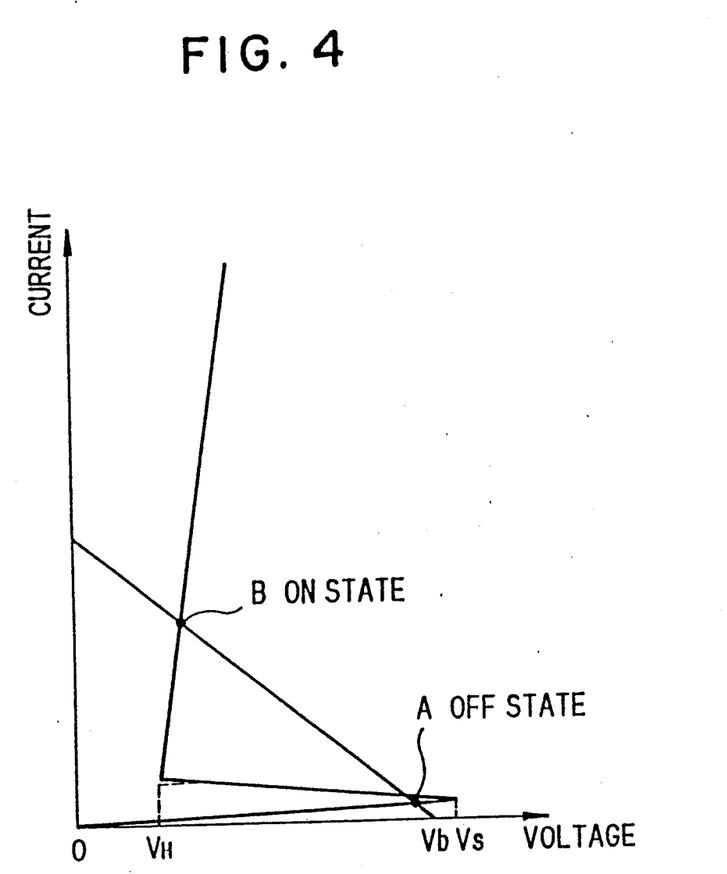
FIG. 4 is a current to voltage curve showing a switching characteristic of a pnpn semiconductor device used for the transmittivity modulation element as shown in FIG. 3.

The transmittivity modulation element 22 has a pnpn structure so that I-V characteristic having two stable points A and B is obtained as shown in FIG. 4. In more detail, where a bias voltage Vb which is less than a switching voltage Vs is applied across the p-and n-electrodes 23 and 24, the element 22 is not turned on to maintain the OFF state as shown by the point A, and, where the bias voltage Vb is increased to the switching voltage Vs, the element 23 is turned on to provide the ON state as shown by the point B. The ON state is maintained by applying a bias voltage which is considerably less than the switching voltage Vs and slightly greater than a holding voltage $V_H$ (approximately 1.4 V) to the element 22.

On the other hand, where the element 22 is in the OFF state in accordance with the application of the bias voltage Vb thereto as shown by the point A, the element 22 is turned on to jump up to the ON state (the point B) by receiving an input light of a predetermined power level, even if the bias voltage Vb is less than the switching voltage Vs. Upon the turning-on of the element 22, a voltage applied across the transmittivity modulation layer 35 is decreased, and an absorption coefficient of light transmitting through the transmittivity modulation layer 35 varies. Especially, the absorption coefficient varies largely in the vicinity of a bandgap energy as seen in an example wherein the absorption coefficient is increased at a wavelength less than or equal to 1.6 μm by approximately thirty percents, since the transmittivity modulation layer 35 is of a multi-quantum well layer.

In modification, although the element 22 includes the transmittivity modulation layer 35 positioned between the two p and n-layers, a transmittivity modulation element may include a transmittivity modulation layer positioned between an anode layer and an n-layer additionally provided on the transmittivity modulation layer. Furthermore, a pnpn type transmittivity modulation element may include reflection mirrors of semiconductor multi-layer films on both facets thereof to provide a Fabry-Perot resonator, into which current is injected in the ON state to lower a refractive index thereof, thereby resulting in the shift of a resonance wavelength. This phenomenon provides a ON/OFF ratio as high as more than 30%.

Figure 5:
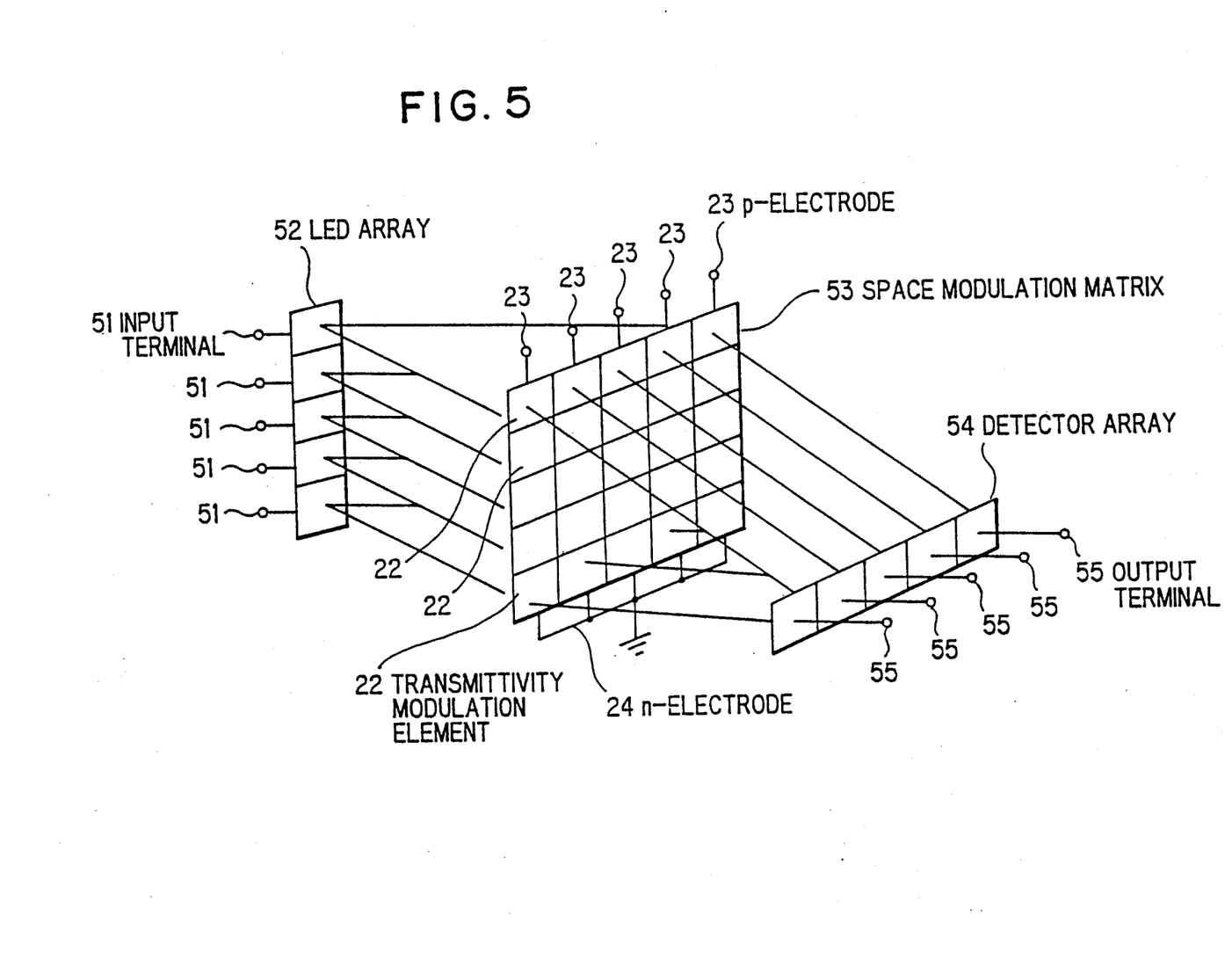
FIG. 5 is an explanatory view showing a semiconductor device for a space modulation matrix in the first embodiment according to the invention.

FIG. 5 shows a semiconductor device for a space modulation matrix in the first embodiment according to the invention. The semiconductor device for a space modulation matrix is applied to an optical association memory, and comprises a light emitting diode array 52 including plural light emitting diodes arranged vertically with a pitch of 30 μm and connected to input terminals 51, a space modulation matrix 53 having transmittivity modulation elements 22 connected to p-electrodes 23 and to a common n-electrode 24 as explained in FIGS. 2 and 3, and a photodiode array 54 including plural photodiodes arranged horizontally and connected to output terminals 55. In the light emitting diode array 52, the light emitting diodes may be replaced by laser devices, etc.

Figure 6A:
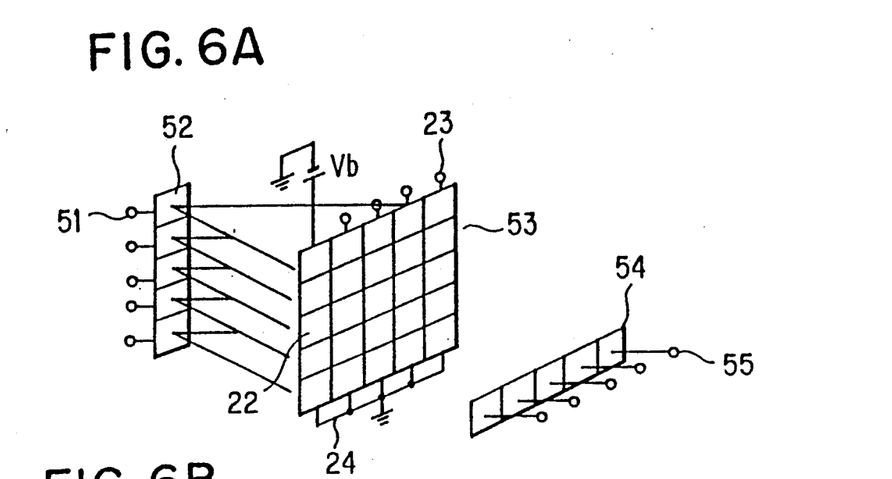
Figure 6B:
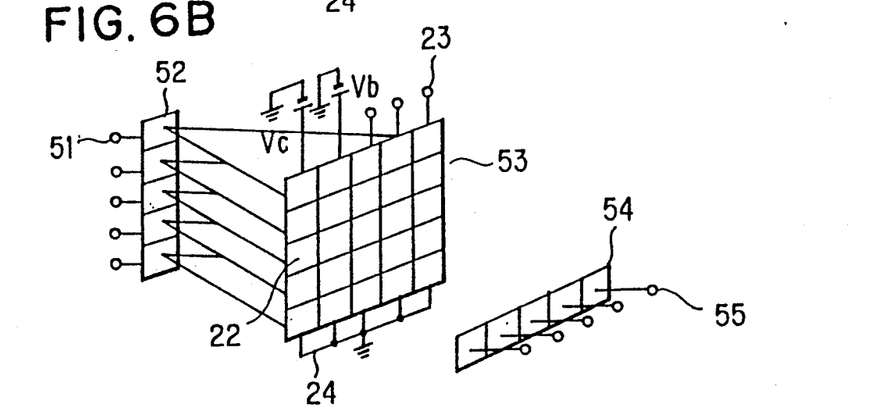
Figure 6C:
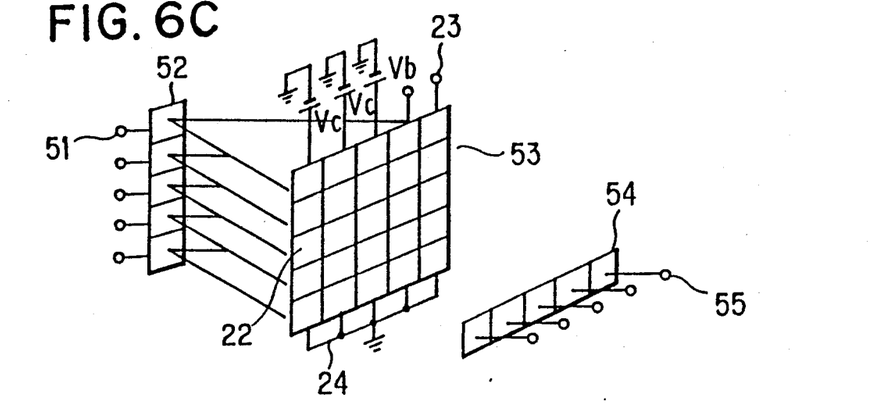

In operation, the bias voltage Vb which is less than the switching voltage Vs is applied across the p-electrode 23 connected to the transmittivity modulation elements 22 of the first row in the space modulation matrix 53 and the common n-electrode 24, and the light emitting diode array 52 is driven to emit lights by voltages according to information applied to the input terminals 51, as shown in FIG. 6A, so that transmittivity modulation elements 22 according to the information applied to the input terminals 51, are turned on among the transmittivity modulation elements 22 by receiving the lights emitted from the light emitting diode array 52. This means that transmittivity information is written into the transmittivity modulation elements 22 of the first row in the space modulation matrix 53. Then, the bias voltage Vb is decreased to an ON holding voltage Vc which is greater than the holding voltage $V_H$, and the bias voltage Vb is applied across the p-electrode 23 of the second row and the common n-electrode 24 together with the radiation of lights according to further information from the light emitting diode array 52, as shown in FIG. 6B, so that the transmittivity information stored in the first row is held, and further transmittivity information is written into the second row. In the circumstance, the transmittivity modulation elements 22 of the first row become less sensitive to lights due to the lowering of the bias voltages Vb to Vc, so that the transmittivity information of the first row is stably maintained without being affected by the information of the second row. In this manner, information is written into the transmittivity modulation elements 22 of the third row and following rows in the space modulation matrix 53 in accordance with the application of the bias voltage Vb thereto, and the stored information is held in the transmittivity modulation elements 22 of the first and second rows and following rows in the space modulation matrix 53 in accordance with the application of the ON holding voltage Vc, as shown in FIG. 6C.

Figure 7A:
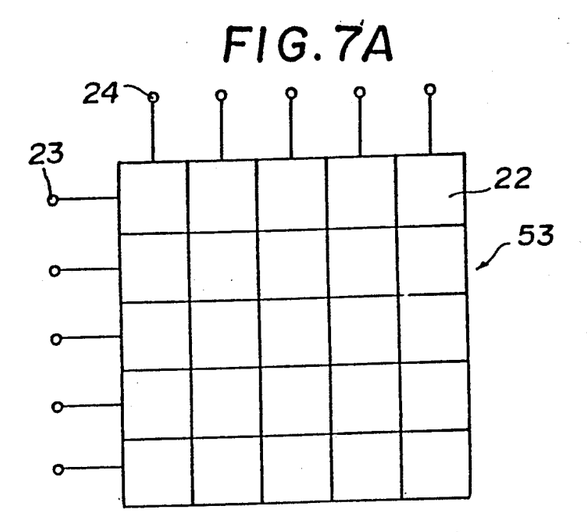
FIG. 7A is an explanatory view showing a space modulation matrix in a second embodiment according to the invention.

FIG. 7A shows a semiconductor device for a space modulation matrix in the second embodiment according to the invention. The semiconductor device for a space modulation matrix comprises a space modulation matrix 53 including transmittivity modulation elements 22 arranged in a matrix pattern, plural p-electrodes 23 each provided for each row of the transmittivity modulation elements 22, and plural n-electrodes 24 each provided for each column of the transmittivity modulation elements 22.

Figure 7B:
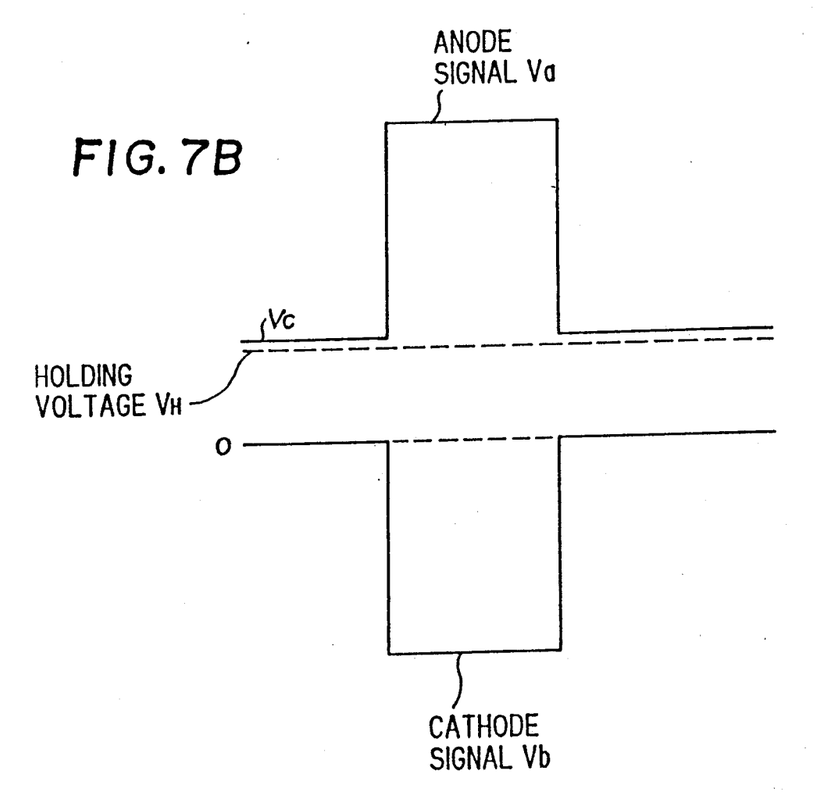
FIG. 7B is a waveform diagram showing anode and cathode signals applied to a transmittivity modulation element in the space modulation matrix in the second embodiment.

In operation, an anode signal having the voltage Vc greater than the holding voltage $V_H$ and a bias voltage Va in a predetermined time sequence is applied to a corresponding one of the p-electrodes 23, and a cathode signal having zero voltage and a negative bias voltage Vb in the predetermined time sequence is applied to a corresponding one of the n-electrodes 24, as shown in FIG. 7B, wherein absolute values of the voltages Va and Vb are less than that of the switching voltage Vs, while the summation of the absolute values is greater than the switching voltage Vs. Consequently, one of the transmittivity modulation elements 22 is turned on at a crossing point between a selected row and an addressed column in accordance with the application of the voltage ($|Va| + |Vb|$) thereto, and the ON state of the transmittivity modulation element 22 is held by the ON holding voltage Vc of the anode signal which is always applied thereto. On the other hand, the remaining transmittivity modulation elements 22 of the selected row and the addressed column is not turned on, since the voltages Va and Vb are less than the switching voltage Vs. Thus, transmittivity information is written into the space modulation matrix 53 and held therein.

Figure 8:
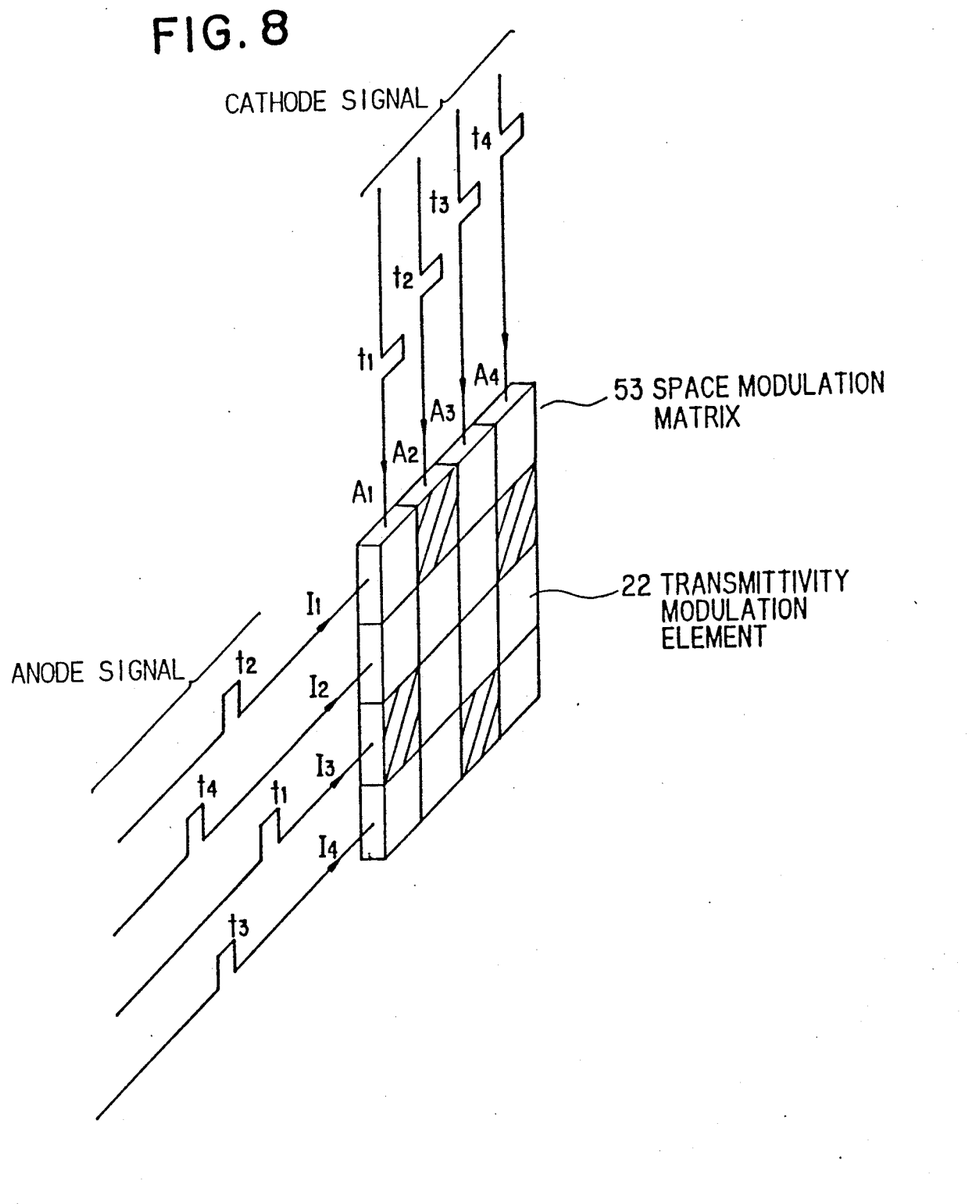
FIG. 8 is an explanatory view showing a method for driving a space modulation matrix in a third embodiment according to the invention.

Instead of driving the space modulation matrix 53 in a method as explained in FIG. 7B, the space modulation matrix 53 may be driven in a method to be explained in FIG. 8 as follows. That is, cathode signals of the aforementioned negative voltage Vb are sequentially applied to columns $A_1$, $A_2$, $A_3$ and $A_4$ of the space modulation matrix 53 at times of $t_1$, $t_2$, $t_3$ and $t_4$, and anode signals of the aforementioned voltage Va are applied to rows selected from rows $I_1$, $I_2$, $I_3$ and $I_4$ of the space modulation matrix 53 at the times of $t_1$, $t_2$, $t_3$ and $t_4$. The number of the selected rows is an integer selected from 0 to 4 in FIG. 8. To be more concrete, the cathode signal is applied to the transmittivity modulation elements 22 of the column $A_1$ at the time $t_1$, and the anode signal is simultaneously applied to the transmittivity modulation elements 22 of a selected row $I_3$, so that a transmittivity modulation element 22 is turned on at a crossing point between the column $A_1$ and the row $I_3$ as illustrated by hatching. At the time $t_2$, the cathode signal is applied to the transmittivity modulation elements 22 of the column $A_2$, and the anode signal is applied to the transmittivity modulation elements 22 of a selected row $I_1$. As a result, a transmittivity modulation element 22 is turned on at a crossing point between the column $A_2$ and the row $I_1$. In this manner, transmittivity information is written into the space modulation matrix 53 by driving the transmittivity modulation matrix 53 at the times $t_3$ and $t_4$, as shown in FIG. 8. As understood from the above, the cathode signal is applied to one of the plural columns on the basis of time sequence, and the anode signal(s) is applied to a selected row(s) of the plural rows on the basis of transmittivity information. Therefore, plural rows can be driven in each column, so that an overall driving time becomes short as compared to a method in which each transmittivity modulation element is driven one by one.

Further to the above-described method as explained with reference to FIG. 8, the space modulation matrix 53 may be driven in a method to be explained in accordance with FIGS. 9 and 10.

Figure 9:
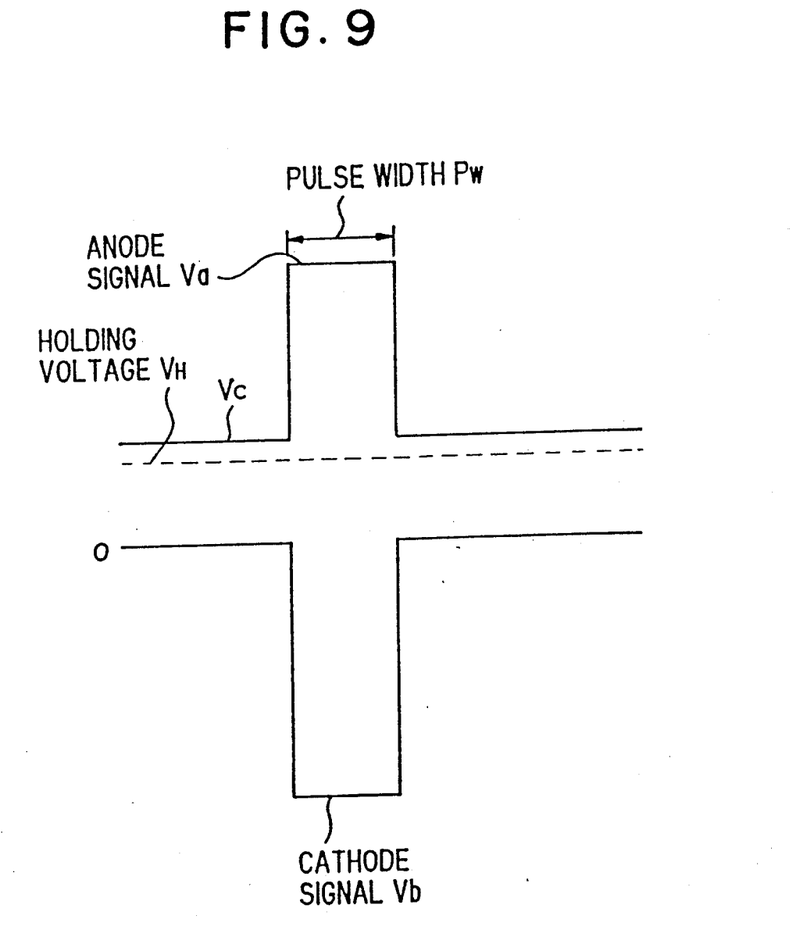
FIG. 9 is a waveform diagram showing anode and cathode signals applied to a transmittivity modulation element in the method for driving a space modulation matrix in the third embodiment.
Figure 10:
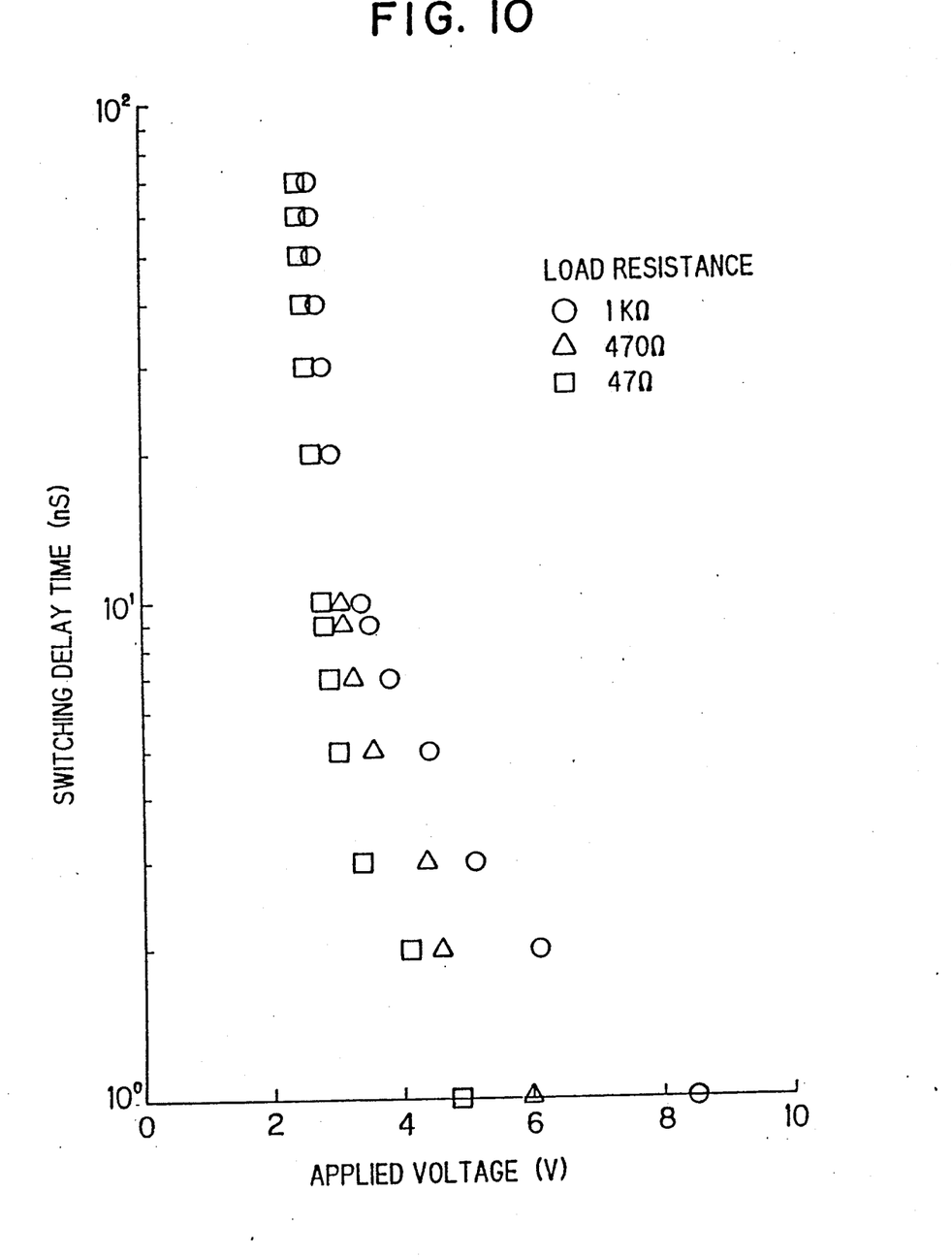
FIG. 10 is a switching delay time to applied voltage curve showing a switching delay characteristic of a pnpn semiconductor device in the third embodiment.

FIG. 9 shows an anode signal consisting of a pulse signal of a voltage Va less than the aforementioned switching voltage Vs and having a pulse width Pw narrower than a switching delay time (to be explained in detail later) and a constant voltage signal of the aforementioned voltage $V_C$ greater than the holding voltage $V_H$, and a cathode signal having a pulse signal of a voltage Vb greater than the aforementioned switching voltage Vs and the pulse width Pw.

The switching delay time will be explained in FIG. 10, wherein a transmittivity modulation element 22 having a switching voltage Vs of 2 to 3 V as shown in FIG. 3 is driven to measure a relation between the switching delay time and the applied voltage in the state that a load resistance having a resistance values selected from 1 kΩ, 470 Ω and 47 Ω is connected in series to the transmittivity modulation element 22. As shown therein, even if the applied voltage is greater than the switching voltage Vs, the switching delay of approximately several hundreds μs to several ns occurs. Therefore, the applied voltage must be increased for the purpose of carrying out high speed switching operation. As a matter of course, the transmittivity modulation element 22 is not turned on even under the application of a voltage greater than the switching voltage Vs during the switching delay time. For this reason, if a pulse width of the applied voltage is shorter than the switching delay time, the transmittivity modulation element 22 is not turned on by the applied voltage of such a pulse width. In this assumption, a further voltage must be added to the applied voltage of the pulse width to shorten the switching delay time, so that the transmittivity modulation element 22 can be turned with a shortened delay time.

For this purpose, the cathode signal are applied to the transmittivity modulation element 22 in addition to the anode signal as shown in FIG. 9.

On the contrary to the aforementioned condition, it is assumed that the voltage Va is greater than the switching voltage Vs, although the pulse width Pw is narrower than the switching delay time. In this assumption, where only one pulse is applied to the transmittivity modulation element 22, the transmittivity modulation element 22 is not turned on for the aforementioned reason. However, where such pulses are applied to the transmittivity modulation element 22 consecutively with an intermittent time, the transmittivity modulation element 22 can be turned on, since carriers injected by each pulse are accumulated in the transmittivity modulation element 22, so that the accumulated carriers exceeds a threshold value. Such a phenomenon may occur in some transmittivity modulation elements 22 in such practical operation that the space modulation matrix 53 is driven, wherein the cathode signal is applied to each column of the space modulation matrix 53 by only one time, while the anode signal is possible to be applied to corresponding rows of the space modulation matrix 53 in accordance with the modulation information by more than one time. This is the reason why the voltage Va of the anode signal is set to be lower than the switching voltage Vs, and the voltage Vb of the cathode signal is set to be greater than the switching voltage Vs as explained in FIG. 9. Therefore, only a transmittivity modulation element 22, which is positioned at a crossing point between a column of the space modulation matrix 53 to which the voltage Vb of the cathode signal is applied and a row of the space modulation matrix 53 to which the voltage Va of the anode signal is applied, is turned on. In one example in which the space modulation matrix 53 is driven by the anode and cathode signals as shown in FIG. 9, each parameter is set as follows.

(a) Voltage Va : 2.3 V (including a DC holding voltage of 1.4 V)
(b) Voltage Vb : 6.7 V
(c) Pulse Width Pw : 1 ns
(d) Load resistance : 1 kΩ

In these parameters, the transmittivity modulation element 22 is turned on by 7 ns. As a result, a large scaled space modulation matrix 53 having transmittivity modulation elements 22 of 1000×1000 can be wholly driven in a very reduced time of 1 s. Therefore, a high speed optical connection is carried out in the invention.

Although n-, p-, n- and p- semiconductor layers are provided on the semi-insulation semiconductor substrate 21, the semiconductor layers may be provided thereon in the reverse order of p, n, p and n. Further InGaAsP system, GaAs on Si system, InGaAsP on Si system, etc. may be used in place of GaAs system.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A semiconductor device for a transmittivity modulation matrix, comprising:

transmittivity modulation elements arranged in a matrix pattern to provide said transmittivity modulation matrix, such that applying a first light radiation to said transmittivity modulation elements causes said transmittivity modulation elements to store said light radiation therein and have a transmittivity representative of said stored light radiation; and a semiconductor device array including semiconductor light emitting devices, light emitted from said semiconductor light emitting devices radiating to a selected number of said transmittivity modulation elements in said transmittivity modulation matrix wherein said first light radiation remains stored therein until a second light radiation is applied which causes said first light radiation stored in said transmittivity modulation matrix to be erased and said second light radiation to be stored therein.

2. A semiconductor device for a transmittivity modulation matrix, according to claim 1, wherein:

each of said transmittivity modulation elements is of a semiconductor device selected from one of adjacent n-, p-, n- and p-semiconductor layers and adjacent p-, n-, p- and n-semiconductor layers.

3. A semiconductor device for a transmittivity modulation matrix, according to claim 1, further comprising:

a semiconductor device array including semiconductor light detecting devices, said light transmitting through said transmittivity modulation matrix being detected by said semiconductor light detecting devices.

4. A method for driving a transmittivity modulation matrix comprising transmittivity modulation elements arranged in a matrix pattern and having a transmittivity representative of light radiated into said transmittivity modulation elements comprising:

radiating light at least once to a selected number of said transmittivity modulation elements in said transmittivity modulation matrix, for changing the transmittivity of said transmittivity modulation elements; and radiating light to said transmittivity modulation matrix on a first side thereof to provide transmitted light on a second side thereof; and detecting said transmitted light to carry out a predetermined calculation.

5. A method for driving a transmittivity modulation matrix responsive to space modulation information, comprising:

arranging transmittivity modulation elements in a matrix pattern to provide said transmittivity modulation matrix;

applying a voltage less than a switching voltage of said transmittivity modulation elements and greater than a holding voltage thereof to said transmittivity modulation elements; and applying a voltage greater than said switching voltage to a selected number of said transmittivity modulation elements to be thereby turned on, whereby a space modulation is provided on said transmittivity modulation matrix.

6. A method for driving a transmittivity modulation matrix, according to claim 5, wherein:

said voltage less than said switching voltage is applied to anodes of said transmittivity modulation elements, while zero voltage is applied to cathodes thereof; and said voltage greater than said switching voltage is the summation of said voltage less than said switching voltage and an absolute value of a negative voltage applied to said cathodes.

7. A method for driving a transmittivity modulation matrix, according to claim 6, wherein:

said voltage less than said switching voltage is applied in parallel to a selected number of said anodes in accordance with said space modulation information.

* * * * *